United States Patent [19]
Schwartz

[11] 3,959,098
[45] May 25, 1976

[54] ELECTROLYTIC ETCHING OF III - V COMPOUND SEMICONDUCTORS

[75] Inventor: Bertram Schwartz, Westfield, N.J.

[73] Assignee: Bell Telephone Laboratories, Incorporated, Murray Hill, N.J.

[22] Filed: Mar. 12, 1973

[21] Appl. No.: 340,046

[52] U.S. Cl. .......................... 204/129.3; 204/129.75
[51] Int. Cl.² ............................................ C25F 3/14
[58] Field of Search .................... 204/129.3, 129.75; 156/17

[56] References Cited
UNITED STATES PATENTS

| | | | |
|---|---|---|---|
| 2,913,383 | 11/1959 | Topfer .............................. | 204/129.3 |
| 3,078,219 | 2/1963 | Chang .............................. | 204/129.75 |
| 3,251,757 | 5/1966 | Schmitz ............................ | 204/129.3 |
| 3,342,652 | 9/1967 | Reisman et al. ...................... | 156/17 |
| 3,418,226 | 12/1968 | Marinace .......................... | 204/129.3 |
| 3,616,349 | 10/1971 | Szupillo .......................... | 204/129.75 |
| 3,791,948 | 2/1974 | Dixon et al. ...................... | 204/129.75 |

FOREIGN PATENTS OR APPLICATIONS

| | | | |
|---|---|---|---|
| 76,861 | 10/1970 | Germany ...................... | 204/129.75 |

OTHER PUBLICATIONS

Haisty, "J. of the Electrochemical Soc.", Vol. 108, No. 8, pp. 790–794, (Aug. 1961).

Schwartz, "J. of the Electrochemical Soc.", Vol. 118, No. 4, pp. 657 & 658, (Apr. 1971).

Faust et al., "J. of Applied Physics", Vol. 31, No. 2, Feb., 1960, pp. 331–333.

Schell, "Z. Metallkde", Bd. 48 (1957) Heft 4, pp. 158–161.

IBM Technical Disclosure Bulletin, Vol. 8, No. 6, Nov., 1965, p. 921.

IBM Technical Disclosure Bulletin, Vol. 9, No. 9, Feb., 1967.

*Primary Examiner*—T. Tung
*Attorney, Agent, or Firm*—L. H. Birnbaum

[57] ABSTRACT

An electrolytic process for etching Group III – Group V semiconductive compounds, especially gallium-containing compound semiconductors. The sample to be etched is made the anode in an electrolytic cell wherein the electrolyte includes nitrate or chloride ions. Etching rates may be easily controlled according to the current supplied to the system.

8 Claims, 5 Drawing Figures

ELECTROLYTIC ETCHING OF III - V COMPOUND SEMICONDUCTORS

BACKGROUND OF THE INVENTION

This invention relates to electrolytic processes for etching III-V compound semiconductors, especially gallium-containing compound semiconductors.

With the expanding use of such compound semiconductors, particularly GaP and GaAs, in light emitting devices, microwave amplifiers and power sources, etc., increasing demand has been made for controllable and economical processing techniques. It is quite apparent that in order to produce discrete devices, as well as integrated circuits, some etching processes are required. Attention in prior art work has focused primarily on various chemical systems to achieve desirable etching characteristics (see, for example, U.S. Pat. No. 3,260,633, issued July 12, 1966 to H. Seiter). Electrolytic etching systems generally are more desirable, however, since etching rates may be easily controlled by controlling the amount of bias applied to the system. Several such systems have been proposed with varying degrees of success (see, for example, U.S. Pat. No. 3,418,226, issued Dec. 24, 1968 to J. C. Marinace). Most of these systems require alkali metal ions in the electrolyte which can adversely affect the electrical as well as the light emitting properties of the treated device both in the short as well as the long term.

It is therefore a primary object of the invention to provide an electrolytic process which will etch a III-V compound semiconductor controllably and, preferably, without the presence of any undesired contaminants that may degrade device properties or contribute to poor aging properties of the device.

SUMMARY OF THE INVENTION

In accordance with the invention, a III-V compound semiconductor to be etched is made the anode in an electrolytic cell wherein the electrolyte contains nitrate or chloride ions. Preferable electrolytes are $HNO_3$, $NH_4NO_3$, $HCl$ and $NH_4Cl$. The etch rate is determined accurately by controlling the current through the cell.

BRIEF DESCRIPTION OF THE DRAWING

These and other features of the invention will be delineated in detail in the description to follow and in the drawing wherein.

DETAILED DESCRIPTION OF THE INVENTION

Figure 1:
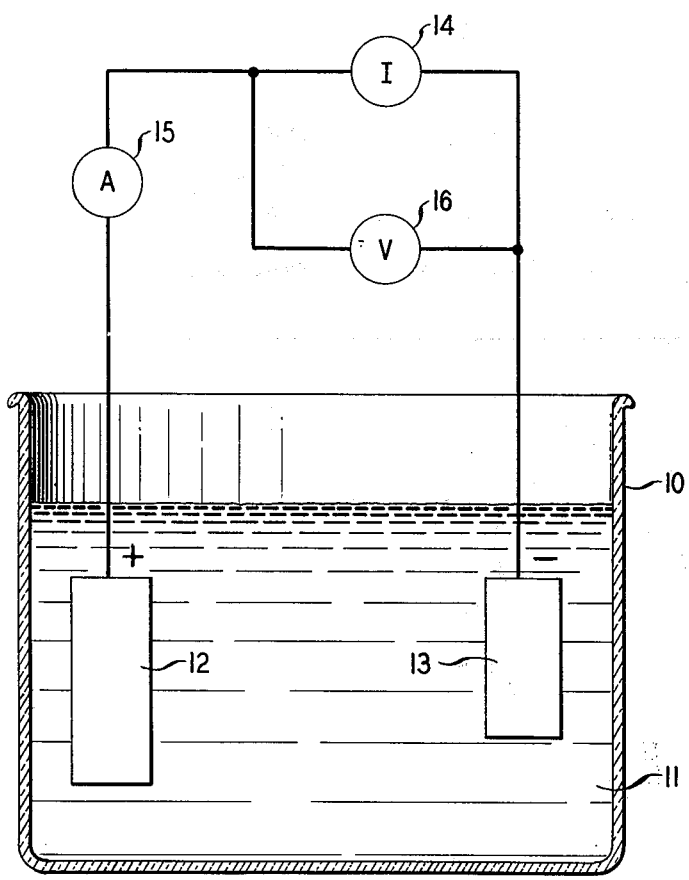
FIG. 1 is a schematic illustration of the electrolytic system in accordance with one embodiment of the invention.

The basic process in accordance with one embodiment is illustrated in FIG. 1. Within an ordinary nonconducting, noncorrosive container, 10, is the electrolyte of the system, 11. In accordance with the invention, the electrolyte is an aqueous solution containing nitrate or chloride ions. Preferably, the solution should be devoid of any contaminating ions such as alkali metals (e.g., K or Na) or heavy metals (e.g., Cu, Zn, Pb) and consequently preferred materials are $HNO_3$, $NH_4NO_3$, $HCl$ and $NH_4Cl$. The sample to be etched, 12, is immersed in the solution and made the anode of the system, while another material, 13, such as a noble metal, is made the cathode. In the embodiment shown and in the experiments described later, a constant current source, 14, was coupled to the electrodes. It should be clear that a constant voltage source could also be used to achieve the same results. An ammeter, 15, and voltmeter, 16, are included in the circuit for purposes of monitoring the process.

The following experiments demonstrate the details of particular embodiments as well as variations which may be employed within the basic process. These particular experiments were performed on samples of Si-doped, n-type GaAs with an impurity concentration of approximately $1 \times 10^{18}$ $cm^{-3}$, and etching time was five minutes in all cases. Platinum was employed as the cathode.

EXAMPLE 1

A sample with a surface area of approximately 0.4 $cm^2$ was immersed in a 1 Normal $HNO_3$ aqueous solution. A constant current of 1 milliampere was applied to the system and after 5 minutes it was determined that a layer of material of approximately 750A deep had been removed from the sample. Subsequent experiments were performed on separate samples with a constant current of 5, 10 and 50 milliamperes applied to the system. This resulted in etching of approximately 3750A, 5000A and 100,000A of material respectively. In the latter two cases, however, a darkening of the surface was observed indicating some damage to the surfaces which could interfere with optimum light emitting properties.

EXAMPLE 2

In this example, a 0.1 Normal $HNO_3$ aqueous solution was utilized as the electrolyte. A sample of 0.5 $cm^2$ surface area was treated and 2000A of material was removed with a constant current of 1 milliampere. From a second sample, also with a surface area of 0.5 $cm^2$, 6000A of material was etched with a constant current of 5 milliamperes. With two other samples, both of 0.4 $cm^2$ surface area, a constant current of 10 and 20 milliamperes was supplied to the system resulting in an etching of 5000A and 65,000A of material, respectively. Again, a blackening of the sample etched with 20 milliamperes of current was observed.

EXAMPLE 3

In this series of experiments, the electrolyte was a 0.01 Normal $HNO_3$ solution. Three different samples all with a surface area of 0.4 $cm^2$ were etched by applying a constant current of 1, 5 and 10 milliamperes, respectively, to the system. The thickness of material removed in these cases was 700A, 800A and 1300A, respectively. No surface damage was observed. Although adequate, the etch rate in this example was relatively slow.

EXAMPLE 4

Instead of the $HNO_3$ solutions, a 0.1 Normal $HCl$ aqueous solution was employed as the electrolyte. Separate samples of 0.4 $cm^2$ surface area were etched with applied currents of 1 and 5 milliamperes. The thickness of material removed was approximately 1000A and 10,000A, respectively, with no noticeable damage to the crystal.

From the above data, it can be seen that preferably the electrolyte has a normality within the range of 0.01 – 1.0 and the current density applied to the system is preferably within the range of 1–25 milliamperes/cm² in order to insure a sufficiently fast etch rate without causing unwanted effects at the crystal surface.

The etching reaction is based on the theory that a native oxide is continually grown into the surface of the sample consuming the material and then the oxide is transformed into a soluble salt by a reaction with the electrolyte. For example, in the case of gallium arsenide samples with $HNO_3$ electrolytes described above, it is believed that the reaction proceeds approximately as follows:

$$2GaAs + 8H_2O \rightarrow Ga_2O_3 \cdot H_2O + As_2O_3 \cdot H_2O + 12H_+ \quad (1)$$

$$Ga_2O_3 \cdot H_2O + 6HNO_3 \rightarrow 2Ga(NO_3)_3 + 4H_2O \quad (2)$$

$$As_2O_3 \cdot H_2O + H_2O \rightarrow H_2As_2O_4 \cdot H_2O \quad (3)$$

Similarly, when HCl is used, the reaction apparently proceeds as follows:

$$Ga_2O_3 \cdot H_2O + 6HCl \rightarrow 2GaCl_3 + 4H_2O \quad (4)$$

In the above cases it will be recognized that the salt of gallium oxide formed is soluble in water.

Since it is known or anticipated that a native oxide can be grown in an aqueous electrolytic system on any compound semiconductor containing an appreciable amount of gallium (at least 5%), it can be reasonably expected that all such materials can also be etched in accordance with the present invention. For example, a sample of Te-doped, n-type GaP with a concentration of approximately $1 \times 10^{18}$ cm³ and surface area of approximately 0.5 cm² was made the anode of an electrolytic system wherein the electrolyte was a 0.1 Normal aqueous $HNO_3$ solution and the cathode was platinum. When a constant current of 5 milliamperes was supplied to the sample for 5 minutes, it was discovered that approximately 100A of material had been etched. A second sample was subjected to an etch at a constant current of 10 milliamperes and approximately 1200A was removed. Some other gallium compound semiconductors which may be etched according to the invention are AlGaAs, AlGaP, GaAsP, InGaP, InGaAs and mixtures thereof. Moreover, since other III-V compounds are very similar to the gallium semiconductors in terms of the relevant chemical properties, it is expected that the same type of etching action will be observed with such compounds when the electrolytes in accordance with the invention are employed. It is, therefore, expected that such materials as InSb and InP, particularly, could be etched with the present system. In general, all III-V compounds, including ternary and quadernary, which exhibit the characteristic of forming native oxides which in turn form soluble salts in the electrolyte should be etched by the electrolytic system described herein.

Figure 2A:
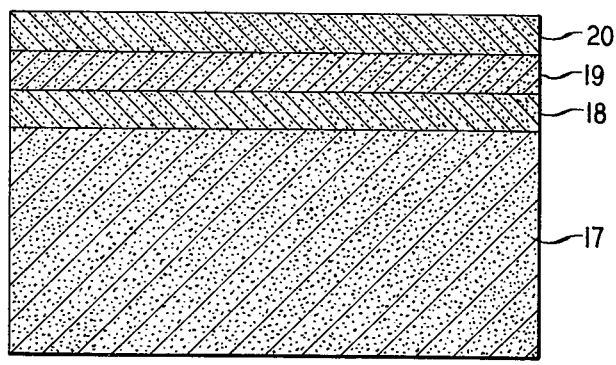
FIGS. 2A–2D are cross sectional views of a device in various stages of manufacture utilizing the invention in accordance with one embodiment.
Figure 2B:
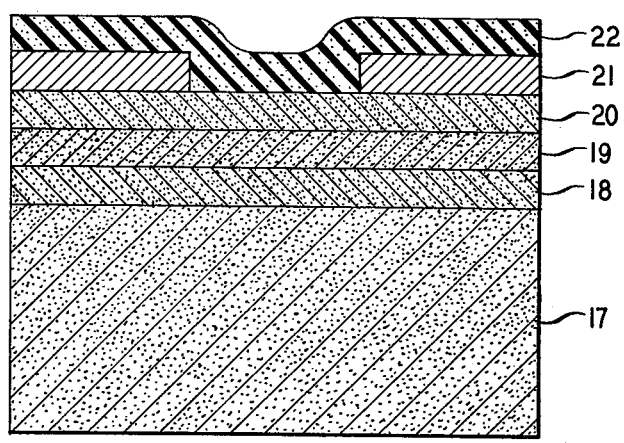
Figure 2C:
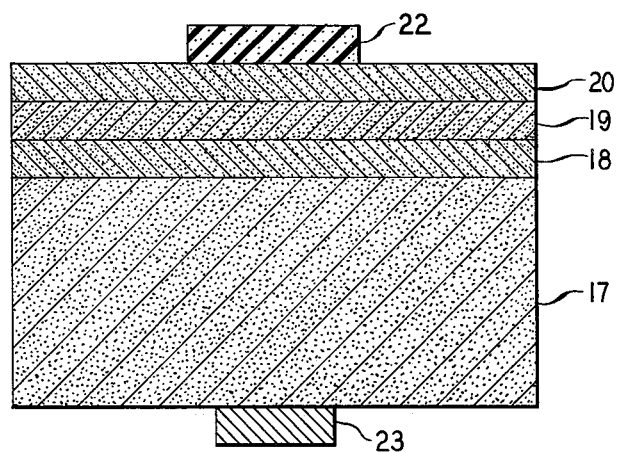
Figure 2D:
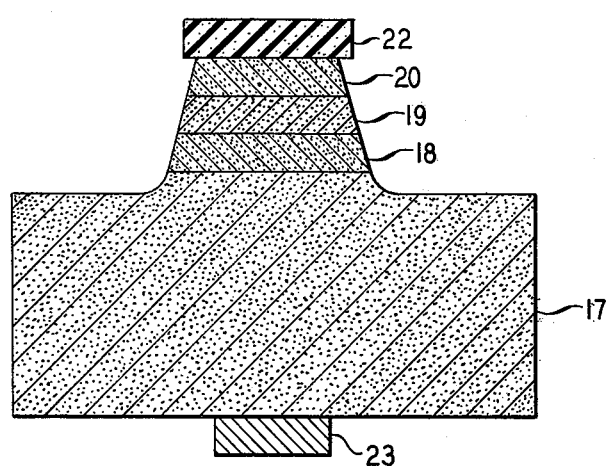

The use of this etching technique to form a particular device is illustrated in FIGS. 2A-2D. FIG. 2A shows a typical laser device geometry known as a double heterostructure. It comprises a substrate, 17, of n-type GaAs which has grown thereon successive layers 18, 19 and 20, n-type AlGaAs, p-type GaAs, and p-type AlGaAs, respectively. It is desirable for various reasons in fabricating an active device or passive waveguide with this structure to form a mesa. This is accomplished as shown in FIG. 2B by first placing a metal mask, 21, on the surface of the device over the area which will be etched, followed by depositing a wax, 22, such as glycol phthalate thereon. When the mask is removed, the wax is located on the surface of the device over the area which will comprise the mesa as shown in FIG. 2C. At this point, the device may be utilized in the electrolytic system shown in FIG. 1 and described above. For this purpose, an ohmic contact, 23, is applied to the bottom surface of the device. The wax, 22, will act as a mask against any etching in the area thereunder. In all other areas, all three layers and a portion of the substrate will be removed to produce the mesa structure shown in FIG. 2D. The wax can then be stripped off, the ohmic contact removed, and the structure is ready for any contacting required in the operation of the device.

It will, of course, be recognized that the foregoing device fabrication is but one example of the use of the present invention and should not be thought of as limiting the inventive etching method as described and claimed.

It will be further noted that the time required to remove a particular amount of material will depend upon the current and voltage supplied, the electrolyte used, and the sample being etched. Once the efficiency of conversion from electricity to chemical change is determined, these times may be easily calculated according to well-known techniques. Consequently, a detailed discussion of this point is omitted for the sake of brevity.

Various additional modifications, such as agitation, will become apparent to those skilled in the art. All such deviations which basically rely on the teachings through which the invention has advanced the art are properly considered within the spirit and scope of the invention.

What is claimed is:
1. A method of etching a III-V compound semiconductor comprising making the semiconductor the anode in an electrolytic cell wherein the electrolyte consists essentially of water and $HNO_3$ wherein the normality of the electrolyte is within the range .01 – 1.0, and passing a current through said cell until a desired etch is reached.
2. The method according to claim 1 wherein the current density through the anode of said cell lies within the range 1–25 milliamperes/cm².
3. The method according to claim 1 wherein the III-V compound semiconductor is selected from the group consisting of GaAs, GaP, AlGaAs, AlGaP, GaAsP, InGaP, InGaAs, InP, and InSb.
4. The method according to claim 1 wherein the III-V compound semiconductor is GaAs.
5. The method according to claim 1 wherein the III-V compound semiconductor is GaP.
6. A method of etching a III-V compound semiconductor comprising making the semiconductor the anode in an electrolytic cell wherein the electrolyte consists essentially of water and HCl wherein the normality lies within the range .01 – 1.0, and passing a current through said cell until a desired etch is reached.
7. The method according to claim 6 wherein the current density through the anode of said cell lies within the range 1–25 milliamperes/cm².
8. The method according to claim 6 wherein the III-V compound semiconductor is selected from the group consisting of GaAs, GaP, AlGaAs, AlGaP, GaAsP, InGaP, InGaAs, InP and InSb.

* * * * *